United States Patent [19]
Kano et al.

[11] Patent Number: 5,539,977
[45] Date of Patent: Jul. 30, 1996

[54] APPARATUS AND METHOD FOR AUTOMATICALLY MOUNTING ELECTRONIC PARTS

[75] Inventors: Yoshinori Kano; Kazunori Takata, both of Ora-gun, Japan

[73] Assignee: Sanyo Electric Co., Ltd., Osaka, Japan

[21] Appl. No.: 330,749

[22] Filed: Oct. 28, 1994

[30] Foreign Application Priority Data

Oct. 29, 1993 [JP] Japan .................................. 5-272377
Nov. 17, 1993 [JP] Japan .................................. 5-288251

[51] Int. Cl.⁶ .............................. H05K 3/30; B23P 21/00
[52] U.S. Cl. ................... 29/833; 29/714; 29/740; 29/840; 340/686; 356/152.2
[58] Field of Search ............................ 29/740, 741, 833, 29/832, 840, 712, 714; 340/686; 356/152.2

[56] References Cited

U.S. PATENT DOCUMENTS

| | | |
|---|---|---|
| 4,706,379 | 11/1987 | Seno et al. . |
| 4,868,973 | 9/1989 | Fujishiro .................................. 29/740 |
| 4,881,319 | 11/1989 | Yagi et al. ........................... 29/740 X |
| 4,905,370 | 3/1990 | Hineno et al. ........................... 29/740 |
| 5,003,692 | 4/1991 | Izumi et al. ......................... 29/740 X |
| 5,031,309 | 7/1991 | Kimm .................................. 29/741 X |
| 5,212,881 | 5/1993 | Nishitsuka et al. . |
| 5,224,262 | 7/1993 | Takaichi et al. ..................... 29/741 X |
| 5,377,405 | 1/1995 | Sakurai et al. ....................... 29/740 X |
| 5,384,956 | 1/1995 | Sakurai et al. ....................... 29/740 X |

FOREIGN PATENT DOCUMENTS

| | | |
|---|---|---|
| 293175 | 11/1988 | European Pat. Off. . |
| 3532500 | 3/1986 | Germany . |
| 60-121671 | 8/1985 | Japan . |

OTHER PUBLICATIONS

European Search Report, dated Feb. 2, 1995, Appl. No. 94117101.9.

*Primary Examiner*—Carl J. Arbes
*Attorney, Agent, or Firm*—Loeb & Loeb LLP

[57] ABSTRACT

An apparatus for automatically mounting electronic parts in which chip-like electronic parts supplied from a parts feeding device are mounted at predetermined positions on a printed substrate. For efficiently and accurately carrying out parts mounting operation by detecting the picked-up state of the electronic parts, the lower end position of the electronic part being held by a holding nozzle is identified at a plurality of points by a lower end position detecting section, while the lower end position memory section stores the detected lower end position. A selecting section selects the lowest end position among the lower end positions detected by the lower end position detecting section, and compares the obtained lowest end position data to data stored in the data memory section including lowest end position data for each sort of electronic part, and a judging section judges if the held state of the electronic part is normal or abnormal.

14 Claims, 13 Drawing Sheets

```
PART SORT            :  AAAAA

PART THICKNESS             :  0.5 mm
PART X SIZE                :  1.6 mm
PART Y SIZE                :  0.8 mm
PART THICKNESS TOLERANCE   :  0.1 mm
NOZZLE LEVEL               :  5.0 mm
```

APPARATUS AND METHOD FOR AUTOMATICALLY MOUNTING ELECTRONIC PARTS

BACKGROUND OF THE INVENTION

1. Field of the Invention

The present invention relates to an apparatus and a method for automatically mounting electronic parts in which electronic parts are taken out from a parts feeding section by means of an holding nozzle provided in a nozzle head and are then mounted on a printed substrate.

2. Description of the Related Art

Heretofore, for continuously and automatically mounting electronic parts on a printed substrate during manufacturing processes, chip-like electronic parts being fed one by one by a parts feeding device or the like are picked up by a holding nozzle using a vacuum pump or a magnet and are then mounted at predetermined positions on the printed substrate. Among such type of automatic electronic parts mounting apparatuses, there is known one having a function of detecting the picked up state of the parts for accurately mounting the parts on the printed substrate.

Such a type of apparatus for automatically mounting electronic parts is disclosed in Japanese Utility Model Laid Open No. Sho 60-121671, in which an orientation of an electronic part being picked up by a holding nozzle is judged as correct when a light beam from a light-emitting element is detected by a light-receiving element. When the thickness of a part varies depending on its type, the height of the light-emitting and light-receiving elements is adjusted by rotating a driving lever in accordance with the thickness information of the parts, so as to make correct judgment of the part's orientation and shape.

According to the aforementioned conventional apparatus, the abnormality of orientation can be detected when the picking up is carried out by an unexpected or incorrect surface of an electronic part. For example, if the picking up is done while the part is in a completely upright state, the incorrect orientation can be detected since the light beam from the light-emitting element is interrupted by the electronic part. On the other hand, however, if the electronic part 100 is held to the take-out nozzle 101 in an inclined state, as shown in FIG. 1, so that the light beam from the light-emitting element passes a point A in FIG. 1 in the direction perpendicular to the sheet, the light beam cannot be interrupted by the electronic part 100. As a result, it would erroneously be judged that the electronic part 100 has correctly been picked up as shown by the two-dot chain line, so as to then be mounted on the printed substrate in the orientation as shown by solid lines. Due to this mislocation of the parts, the substrate would become defective.

SUMMARY OF THE INVENTION

It is therefore an object of this invention to provide an apparatus and a method for automatically mounting electronic parts, capable of securely detecting any abnormality of the orientation or the shape of electronic parts having been picked up by the holding nozzle.

According to this invention, an apparatus for automatically mounting chip-like electronic parts at predetermined positions on a printed substrate comprising: a holding nozzle for picking up electronic parts one by one; a nozzle head having at least one holding nozzle; a movable base for intermittently moving said nozzle head between a plurality of work stations; a lower end position detecting section for detecting a plurality of lower end positions by recognizing lower positions at a plurality of points of the electronic part having been picked up by said holding nozzle during the moving or stopping time of said nozzle head; a lower end position memory section for storing the lower end positions detected by said lower end position detecting section; a selecting section for selecting the lowest end position among the lower end positions detected by said lower end position detecting section; a data memory section for storing shape information including a reference lower end position of each of the sorts of electronic parts; and a judging section for judging if the held state of the electronic parts held by said holding nozzle is correct from an error of the lower end position by comparing the lowest end position selected by said selecting section to a reference lower end position stored in said data memory section.

According to another aspect of this invention, the apparatus further comprises a position adjusting mechanism for adjusting a position of the holding nozzle relative to the lower end position detecting section.

According to another aspect of this invention, a method for mounting electronic parts taken out from a parts feeding section by a holding nozzle provided in a movable base in a printed substrate, comprising steps of: picked up the electronic parts by the holding nozzle; detecting lower end positions of the electronic parts at a plurality of positions at the lower end portions of the electronic parts during moving or stopping time of the movable base; judging abnormality of orientation or shape of the electronic parts based on a plurality of lower end positions detected by said lower end position detecting step; and mounting only the electronic parts, which have been judged as normal by said judging step, on the printed substrate.

According to another aspect of this invention, a method for mounting electronic parts taken out from a parts feeding section by a holding nozzle provided in a movable base on a printed substrate, comprising steps of: picked up the electronic parts by the holding nozzle; detecting lower end positions of the electronic parts at a plurality of positions at the lower end portion of the electronic parts by adjusting a position relative to a lower end position detecting section for detecting lower end position of the electronic parts having been picked up by the adsorptive nozzle; judging abnormality of orientation or shape of the parts on the basis of a plurality of lower end positions detected in said lower end position detecting step, by way of comparison to reference data; and mounting only electronic parts having been judged as normal in said judging step on the printed substrate.

Namely, the lower end position detecting section detects lower end positions at a plurality of points (at the lower end surface of the electronic parts) during the movement between the work stations or intermittent stopping of the electronic parts, having been taken out from the parts feeding device by the holding nozzle. The detected lower end positions are stored in the lower end position memory section. The selecting section selects the lowest end position among a plurality of detected lower end positions. The selected lowest end position is then compared to shape information including a reference lower end position stored in the data memory section for each of the sorts of electronic parts, so that the held state of the electronic part is judged to be normal or abnormal from the error of the lower end positions of both.

As a result, according to the apparatus of this invention, since the held state of the electronic parts are recognized on the basis of the lower end positions detected at a plurality of positions, it is possible to securely identify any abnormal held orientations, such as being held in an inclined manner, which have been erroneously identified hitherto to be normal.

Further, since a plurality of lower end positions are detected by adjusting the relative position of the holding nozzle to the lower end position detecting section by the position adjusting mechanism, an efficient detection of the lower end positions can be realized at an optimum detecting interval for all of electronic parts regardless of the intermittent moving speed of the nozzle head. In addition, by reducing the detecting interval, the undesirably bent state of the lead terminal of the electronic parts can be surely detected, leading to lower defects when mounting them on the printed substrate.

According to the method of this invention, since the lower end positions are detected at a plurality of points, it is possible to efficiently and surely detect abnormalities of orientation of the electronic parts picked up by the holding nozzle or the shape abnormalities thereof, thereby reducing defects of mounting the electronic parts on the printed substrate.

The above and other objects, features and advantages of the present invention will become clear from the following description of the preferred embodiment thereof, taken in conjunction with the accompanying drawings.

DETAILED DESCRIPTION OF THE PREFERRED EMBODIMENTS

Figure 2:
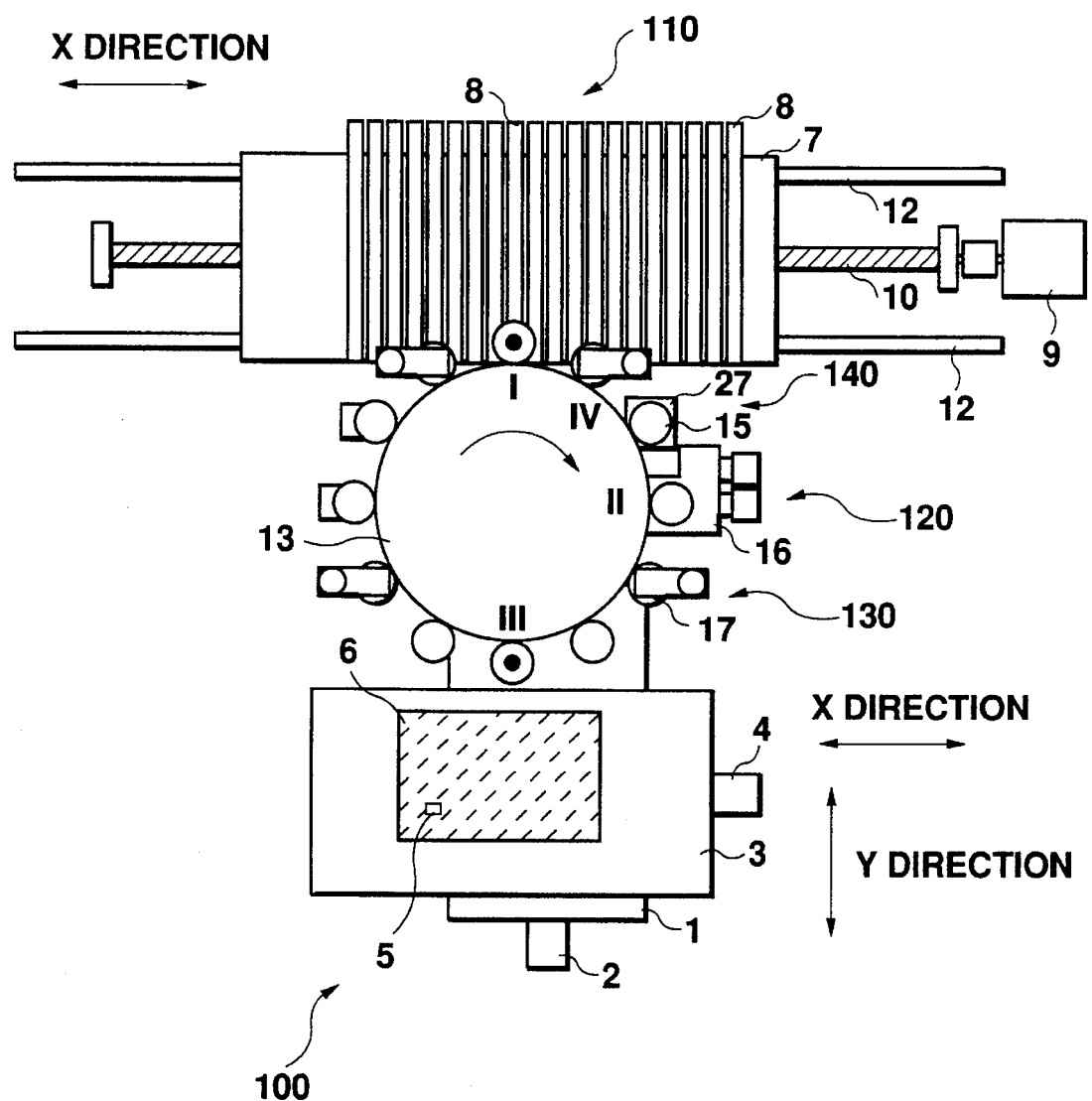
FIG. 2 is a schematic plan view of an apparatus for automatically mounting electronic parts according to this invention.
Figure 3:
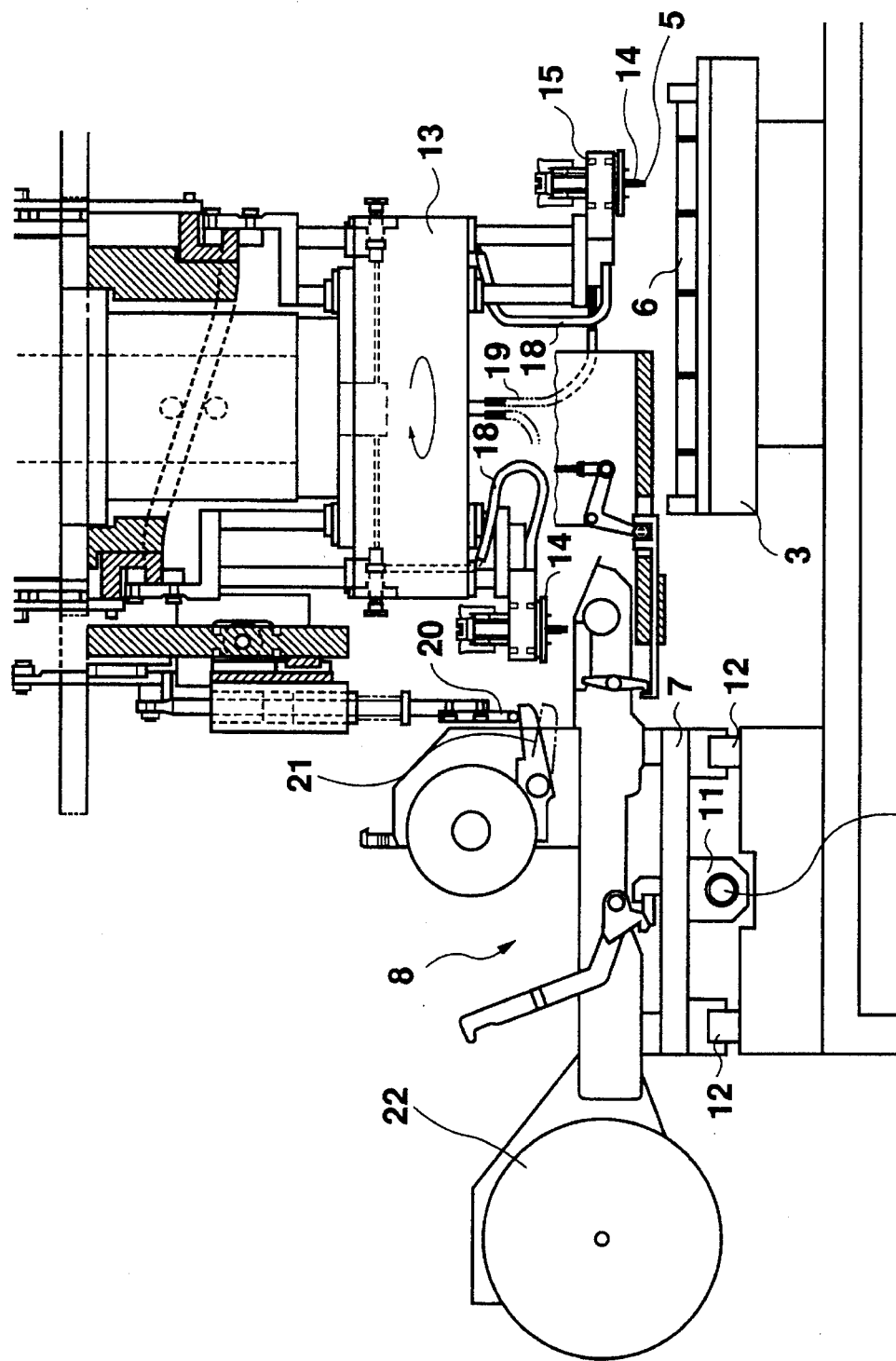
FIG. 3 is a side view of an apparatus for automatically mounting electronic parts according to this invention.

In FIGS. 2 and 3, a Y table 1 moves in the Y direction by rotation of a Y-axis motor 2, while an X table 3 moves in the X direction on the Y table 1 by the rotation of an X-axis motor 4. These tables 1 and 3 constitute an XY table for moving a printed substrate 6 mounted on the X table in the XY direction and also compose a parts-mounting station 100.

The printed substrate 6 carrying a chip-like electronic part (hereinafter referred to as part) 5 is fixed on a not shown fixing means on the X table.

On the other hand, a plurality of parts feeding devices 8, for feeding parts 5, are provided on a feeding base 7 as a holding station 110 at a position opposed to that of the parts mounting station 100. The feeding base 7 is moved in the x direction by a ball screw 10 rotated by a feeding base driving motor 9. Namely, the feeding base 7 moves in the X direction while being guided by the linear guide 12 through the ball screw 10 screwed into the threaded hole 11 fixed to the feeding base 7. A rotary table 13 intermittently rotating as a movable base is located between the mounting station 100 and the holding station 110, and a nozzle head (mounting head) 15 having six holding nozzles 14 are provided with a regular interval in accordance with the intermittent pitch of the rotary table 13 at the outer circumference of the rotary table 13.

The nozzle head 15 stops at the stopping position I indicated by a black dot in the upper middle portion in FIG. 2 such that the holding nozzle 14 picks up and takes out the part 5 from the parts feeding device 8 at the parts collection station 110. The holding nozzle 14 picks up the part 5 by the lowering of the mounting head 15 at the stopping position 1. The picking up of the part 5 is carried out for example by vacuum sucking. The holding nozzle 14 is connected to a vacuum source such as a not shown vacuum pump via a vacuum tube 18 connected to the nozzle head 15.

A parts identifying station 120 is located between the parts collection station 110 and the parts mounting station 100. When the nozzle head 15 having picked up the part 5 at the stopping position II stops by the intermittent rotation of the rotary table 13, the positional gap of the part 5 relative to the holding nozzle 14 is identified by the parts identifying device 16.

In the part identifying station 120, a camera is provided as the parts identifying device 16. The camera images the positional gap of the part 5 picked up by the holding nozzle 14 at the lower surface of the part 5 with a predetermined visual field range and recognizes the imaged part using an identifying processing.

The stopping position of the nozzle head 15 next to the identifying station 120 is an angle correcting station 130. A head rotating device 17 being composed of a robot arm etc. rotates the nozzle head 15 in the θ direction by an angular amount for correcting the angular positional divergence of the chip part 5 from the identified result of the part identifying device 16 and an angular amount indicated by not shown mounting data.

Figure 1:
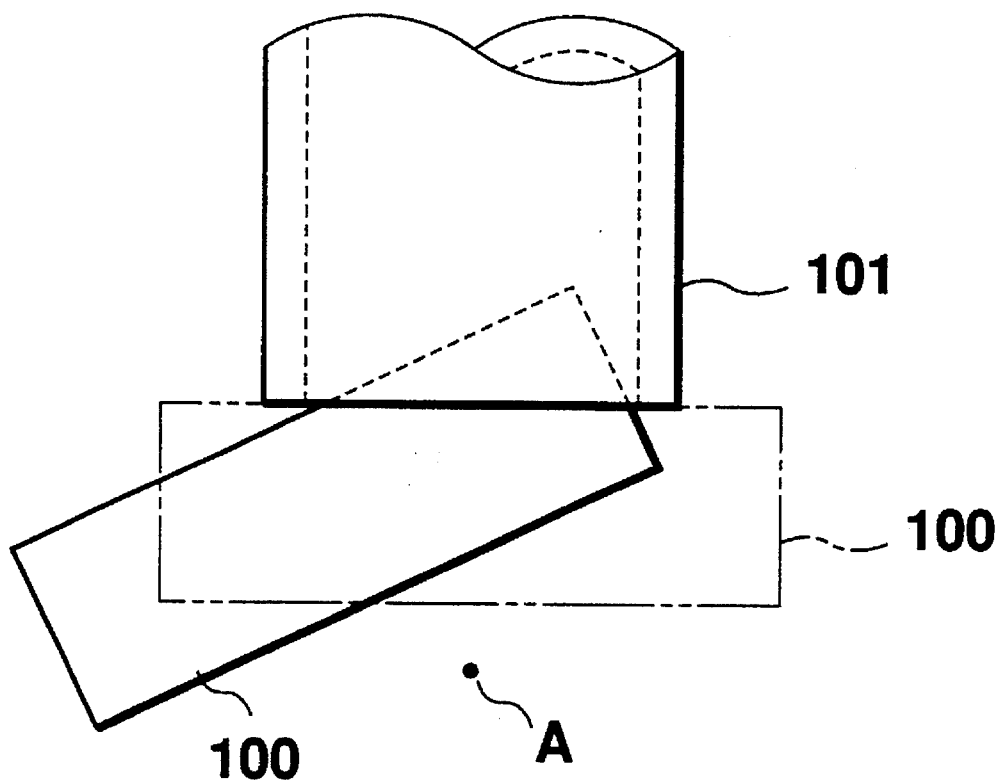
FIG. 1 is an explanatory view showing a manner for detecting any abnormality in the state of the electronic parts being held by the holding nozzle in a conventional automatic mounting apparatus.

The stopping position next but one to the angle correcting station 130 (position III indicated by a black dot at the lower part in FIG. 1) is a mounting station 100 where the part 5 picked up by the holding nozzle 14 is mounted on the printed substrate 6.

In FIG. 3, a vertically movable up-down stick 20 engages with a pivot lever 21 of the parts feeding device 8 to pivotally move the pivot lever 21 and intermittently feeds not shown parts storage tape in which the chip parts are inserted with a predetermined interval in accordance with this interval for feeding the chip parts 5 to the parts picking up position of the holding nozzle 14. The parts storage tape is wound around a tape reel 22.

Figure 4:
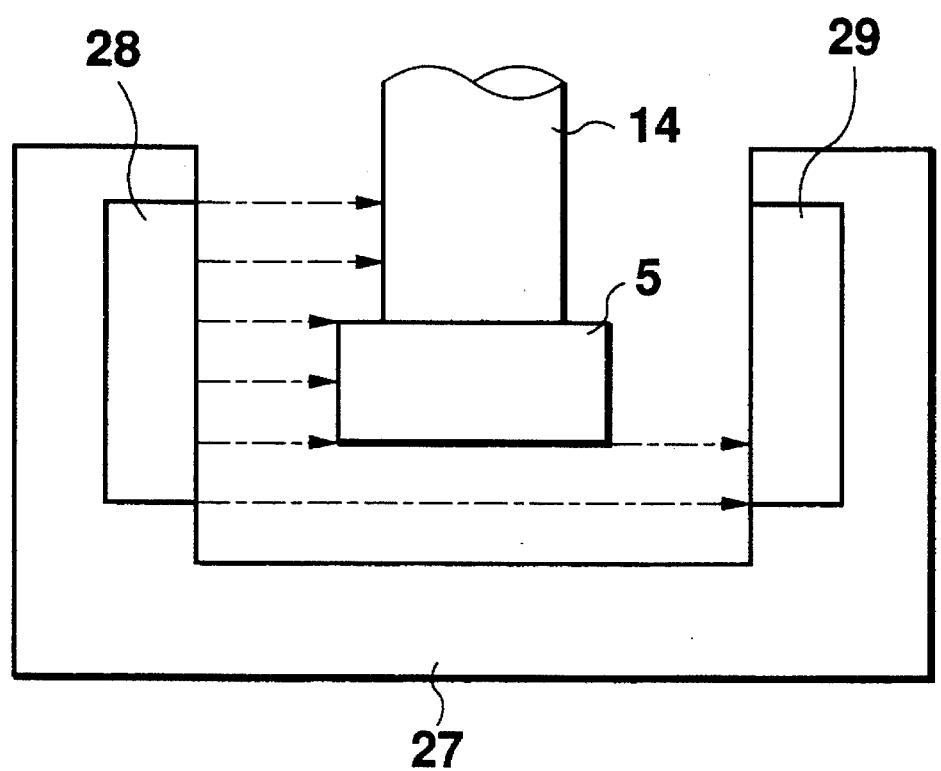
FIG. 4 is a schematic view for explanation of the lower end positioned detecting section of an apparatus for automatically mounting electronic parts according to a first embodiment of this invention.

In FIG. 2, the station next but one to the collection station 110 has a line sensor 27 as a lower end detecting section for detecting the orientation of the part 5 being picked up by the holding nozzle 14. Referring to FIG. 4, the line sensor 27 is composed of a light emitter 28 having a number of vertically arranged light-emitting elements and a light receiver 29 having a number of light-receiving elements (CCD) on the line in the vertical direction. The light emitter 28 may be constituted to emit light from an LED which is collected by a lens and projected in parallel, or alternatively a laser can be used. As the CCD element, one being composed of one thousand elements arranged in a vertical width of approximately 10 mm may be used. In this type of CCD, the light amount received by each element can be detected. Therefore, by determining a threshold value of the light receiving amount it can also be used as an ON/OFF sensor. Its ON/OFF output will become height positional data by identifying the portion being interrupted by the part 5 or the holding nozzle 14.

The line sensor 27 is mounted at a position where the holding nozzle 14 picks up the part 5 by the rotation of the rotary table 13 so that the light projected by the light emitter 28 strikes approximately the center of the holding nozzle 14.

Figure 5:
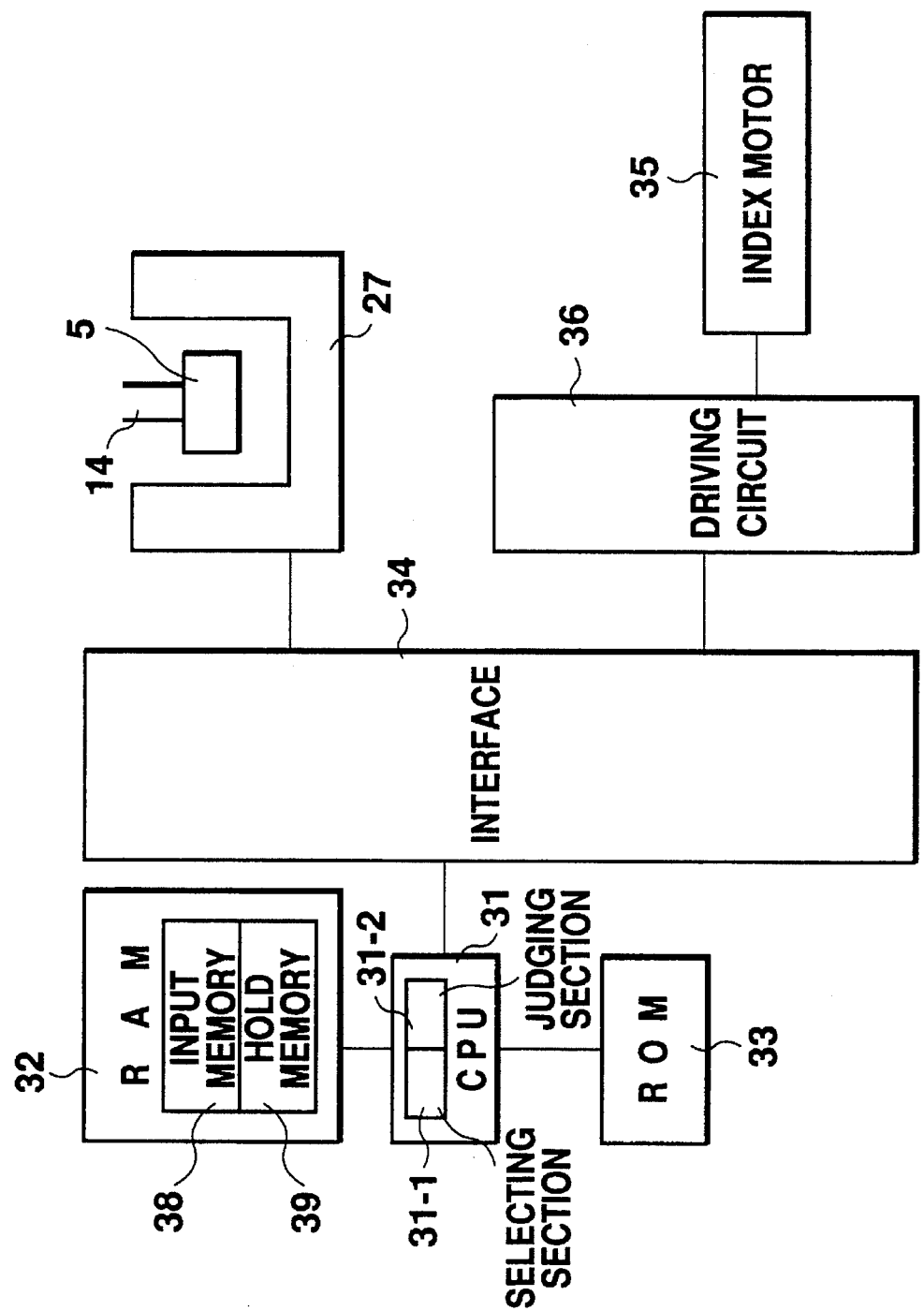
FIG. 5 is a block diagram of a controlling operation of the apparatus for automatically mounting electronic parts according to a first embodiment of this invention.

A controlling block of an automatic electronic parts mounting device according to this embodiment will now be described with reference to FIG. 5.

A CPU 31 controls a variety of operations related to the mounting of the chip parts 5 in accordance with programs stored in a ROM 33, based on a variety of data stored in a RAM 32 and information from sensors such as the line sensor 27. The line sensor 27 is coupled to the CPU 31 via the an interface 34. An index motor 35 of the rotary table 13 being a control target of the CPU 31 is connected to the CPU 31 via the interface 34 and the driving circuit 36.

The output of the line sensor 27 is from each CCD element, and a height position at a border between the lowest light-interrupted element and a light-receiving element next to the light-interrupted element is calculated by the CPU as a lower end peak value of the part 5.

The RAM 32 has an input memory as a latch section for temporarily holding a lower end position detected during the movement and a hold memory 39 as a lower end memory section for holding the lowest end data among the lower end positions being held by the input memory 38. Namely, the input memory 38 stores data calculated at a regular time interval from the output of the line sensor 27. A selecting section 31-1 included in the CPU 31 compares data actually input to the input memory 38 to data previously held in the hold memory 39, and selects the larger one, i.e. the lower one to be stored in the hold memory 39.

Figures 6, 8:
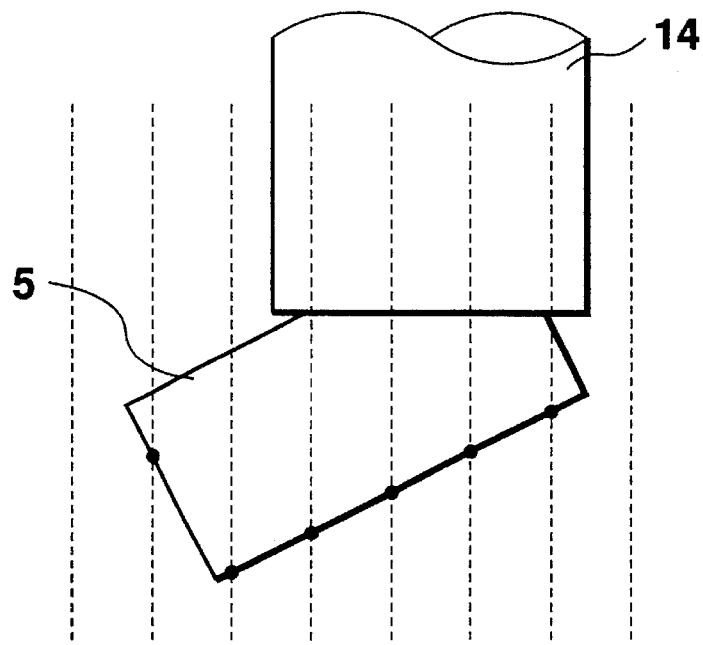
FIG. 6 is an example of shape data for each of the electronic part stored in a data memory section of an apparatus for automatically mounting electronic parts according to this invention.
FIG. 8 is an explanatory view of a lower end position detecting state by the lower end position detecting section of the apparatus for automatically mounting electronic parts according to a first embodiment of this invention.

Further, the data memory section of the RAM 32 stores parts data as shown in FIG. 6 for each of the sorts of part. This parts data comprises data of parts thickness for comparing with a height position as the lowest end position stored in the hold memory 39 and data of parts thickness tolerance to be used in that comparison.

In operation, firstly a manipulating section not shown is operated to start an automatic operation of the automatic electronic parts mounting apparatus. The feeding base 7 then moves in accordance with the data for the mounting order of the parts 5 stored in the RAM 32, to stop the parts supplying device 8 at the collecting position of the holding nozzle 14 of the nozzle head 15, such that the chip part 5 is taken out by the down movement of the nozzle 14.

Next the rotary table 13 intermittently rotates via an index mechanism not shown by the rotation of the index motor 35. The nozzle head 15 moves to the next station and stops there, and further moves to the parts orientation detecting station 140 having the line sensor 27, by the next rotation.

Figure 7:
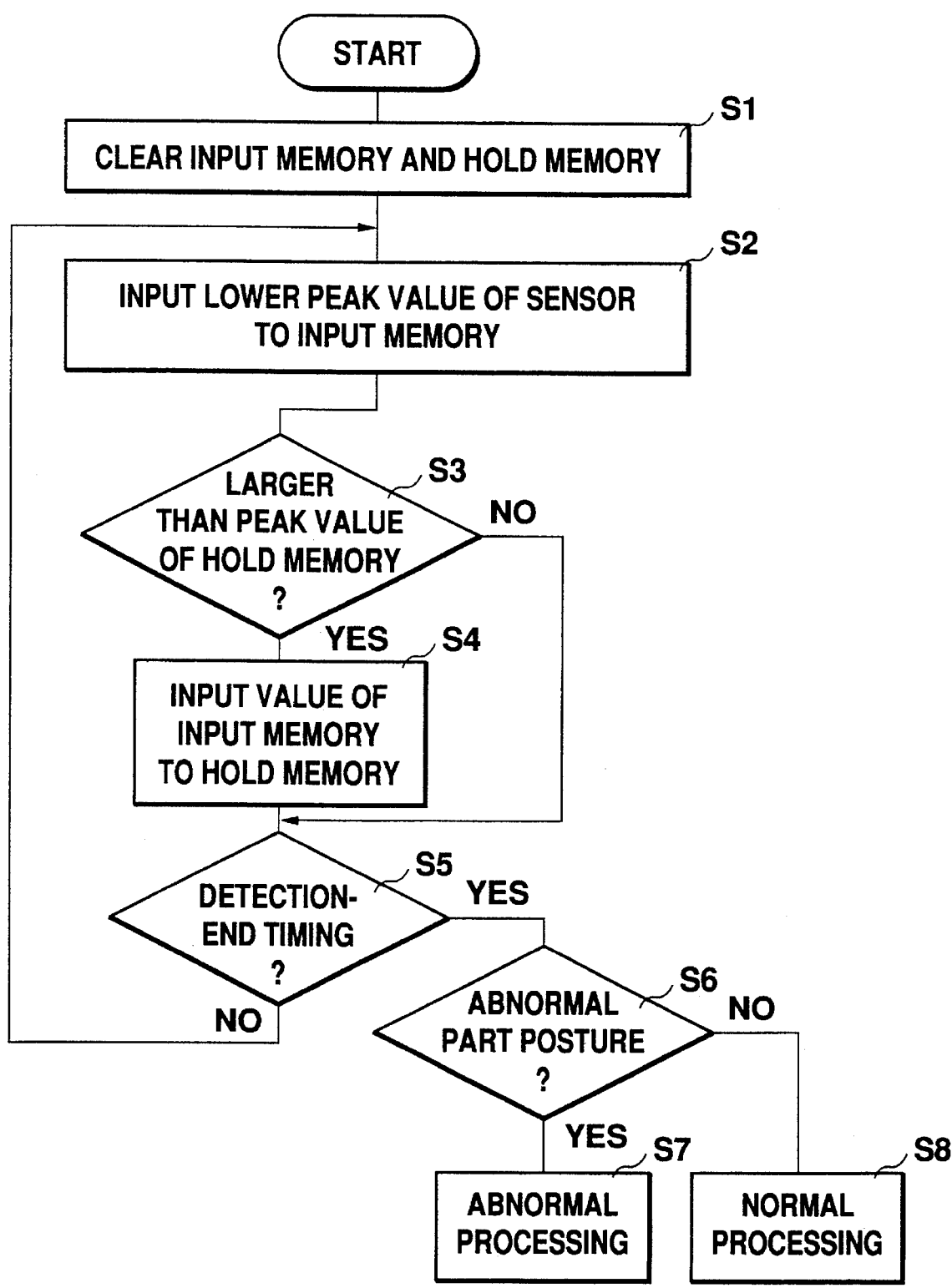
FIG. 7 is a flow diagram for explanation of operation of an apparatus for automatically mounting electronic parts according to a first embodiment of this invention.

After the nozzle head 15 passes through a position a little bit before stopping at the parts orientation detecting station 140 by the rotation of the rotary table 13, the CPU 31 detects this timing to execute the operations described in the flow diagram of FIG. 7. This timing is detected by the CPU 31 when a not shown sensor for detecting the predetermined rotary angle of the cam shaft which makes one rotation for each intermittent rotation of the rotary table 13 is actuated. As a result, a timing signal is output each time the nozzle head 15 advances a certain distance. This timing signal should preferably be output with the alignment divergence of the parts 5 picked up by the holding nozzle 14 in the moving direction being taken account. For example, even when the largest part among the parts 5 to be identified is picked up with a divergence toward the front side, due to alignment divergence, so as to put the detection starting point forward, the size of the part and the alignment divergence are taken into consideration to enable the output of the timing signal to start the detection even though the distal end of the part 5 has not yet, arrived at the light beam position, being the detection point of the line sensor 27. The light beam from the light emitter 28 of the line sensor 27 is continuously emitted and is continuously received by the light receiver 29, and the output is continuous. It is also possible to construct it such that at the detection starting timing, the light emitter 28 emits light to start the output of the line sensor 27. Alternatively it is also possible to set a detection start and a later-mentioned detection end timing within a range being capable of making detection for a certain size of part 5.

With this start timing signal, the input memory 38 and the hold memory 39 are firstly cleared (S1), and the CPU 31 calculates the lowest transit position from the light-interrupted state to the light-receiving state as the lower end peak value which is then stored in the input memory 38 (S2). The origin of this value is set to be above the height position of the lower end surface of the holding nozzle 14 in order to make the upper side positive.

The selecting section 31-1 of the CPU 31 compares this value to the value of the hold memory 39 and stores the larger value in the hold memory 39 (S3–S4). But since there is no part 5 for the initial period, the value remains "0". During this process the nozzle 14 moves, but the CPU 31 executes the same process since it is different from the end timing (S5). When the CPU 31 receives the output when the position indicated by a second dotted line from the left end in FIG. 8 becomes the position of the light beam of the light emitter 28, a lower end position indicated by the black dots on the dotted lines in FIG. 8 is calculated. The value at this position is stored in the input memory 38. That value is then compared to the value of the hold memory 39 and turns out to be larger so as to be input to the hold memory 39. During this process the nozzle 14 moves, and at the time of the next input to the CPU 31, this value will become larger than that of the hold memory 39. As a result, the value of the hold memory 39 is renewed.

At the next reading position the lower end position becomes higher while the value of the lower end position becomes smaller, so that the value of the hold memory is maintained as it is even if the aforementioned comparison is executed.

In this manner, the output from the line sensor 27 is read out at the position of the vertical dotted line in FIG. 8 where the predetermined amount of rotation of the nozzle head is completed. When the detection end timing is detected by a sensor mounted on a not shown cam shaft, the CPU 31 stops reading and the judging section 31-2 compares the value stored in the hold memory i.e. the value of the lowest end position, to a value of corresponding to the parts thickness of the parts data stored in the RAM 32 added to the data at the nozzle level at the lower end position of the holding nozzle 14 (S6). If the difference is out of the parts thickness tolerance and the value in the hold memory is larger, it is judged as abnormal holding (abnormal orientation), and the following processing is executed to correct the abnormality (S7).

In the processing to correct the abnormality, even if the holding nozzle 14 stops at the stopping station thereafter, no parts mounting operations are carried out, and likewise no parts mounting is executed at the mounting station, but the chip part 5 is evacuated at a predetermined evacuating station.

In the case of the chip part 5 being normally held, when the part 5 arrives at the station provided with the line sensor 27 by the moving of the mounting head 15, the height level of the lower end surface of the part 5 is detected by the line sensor 27 as aforementioned. Each time the CPU 31 reads the data, the data is stored in the input memory 38 while the lowest end position is stored in the hold memory 39. When the holding is completed normally, the value of the input memory 38 will be approximately constant and the CPU 31 judges if the part orientation is abnormal or not after the detection end timing. Also, in the same manner as aforementioned, the CPU judges as normal since the value is within the parts tolerance in comparison with the nozzle data of the parts data and the lower end position of the parts thickness data(S8), so as to control the following normal processing operations.

The identifying device 16 executes the identifying process at the identifying station, and the head 15 rotates to cause angular movement of the chip part 5, so as to make fine adjustment, and the chip part 5 is mounted on the printed substrate 6 positioned by the movement of the XY table 3, 1 at the mounting station. At this time, since the lower end position being the lower end height position of the part 5 is already detected, the down moving distance of the holding nozzle is adjusted in accordance with the lower end position so that the part 5 is mounted on the printed substrate 6 with a proper pressure.

When the part 5 is not picked up by the holding nozzle, the value of the hold memory 39 due to the output from the line sensor 27 corresponds to the lower end height position of the holding nozzle 14. As a result, it is judged that there is no part 5. Also in this case, no parts mounting operation is executed, similarly to the processing for an abnormality.

When the value of the hold memory 39 is larger than the lower end position of the nozzle 14 but is smaller than the lower end position in view of the part thickness so as to exceed the tolerance range as a result of picking up an incorrectly sized part 5, the CPU 31 judges it abnormal to stop the mounting operation of the part 5 which will then be evacuated at the predetermined evacuating station.

In this embodiment, the line sensor 27 detects the lower end position for the moving part 5 at a time before or after stopping at the stopping station of the rotary table 13, and it is also possible to make the detection for a moving part 5 by providing the line sensor between the stations.

A second embodiment of this invention will now be described with reference to FIGS. 9–14.

In the aforementioned first embodiment, the lower end position is detected during the rotary movement of the rotary table 13, so that the detecting interval of the lower end position is affected by the rotating speed of the rotary table 13. As a result, if the rotating speed of the rotary table 13 is too large, the reliability of the lower end position detection may be reduced due to excessively expand the detection interval. To cope with this problem, there is provided in this embodiment a method for detecting the lower end position which is not affected by the rotation of the rotary table 13.

In the second embodiment, the composition of the mounting station 100, the collection station 110, and the parts identifying station 120 are the same as in the previous embodiment so as to be omitted from description. The parts posture detecting station 140 is newly provided, and so will be explained in detail.

The line sensor 27 is composed of the light emitter 28 and the light receiver 29 arranged on a virtual line connecting the center of the mounting head 15 to the rotary center of the rotary table 13, and the light emitter 28 and the light receiver 29 are located at a position with the head 15 therebetween. The light beam of the light emitter 28 can be arranged such that the light beam from the light emitter 28 becomes parallel to the virtual line. Also the sensor 27 can be located at a position rotated to a certain extent so long as the moving nozzle 14 does not hit it.

Figure 9:
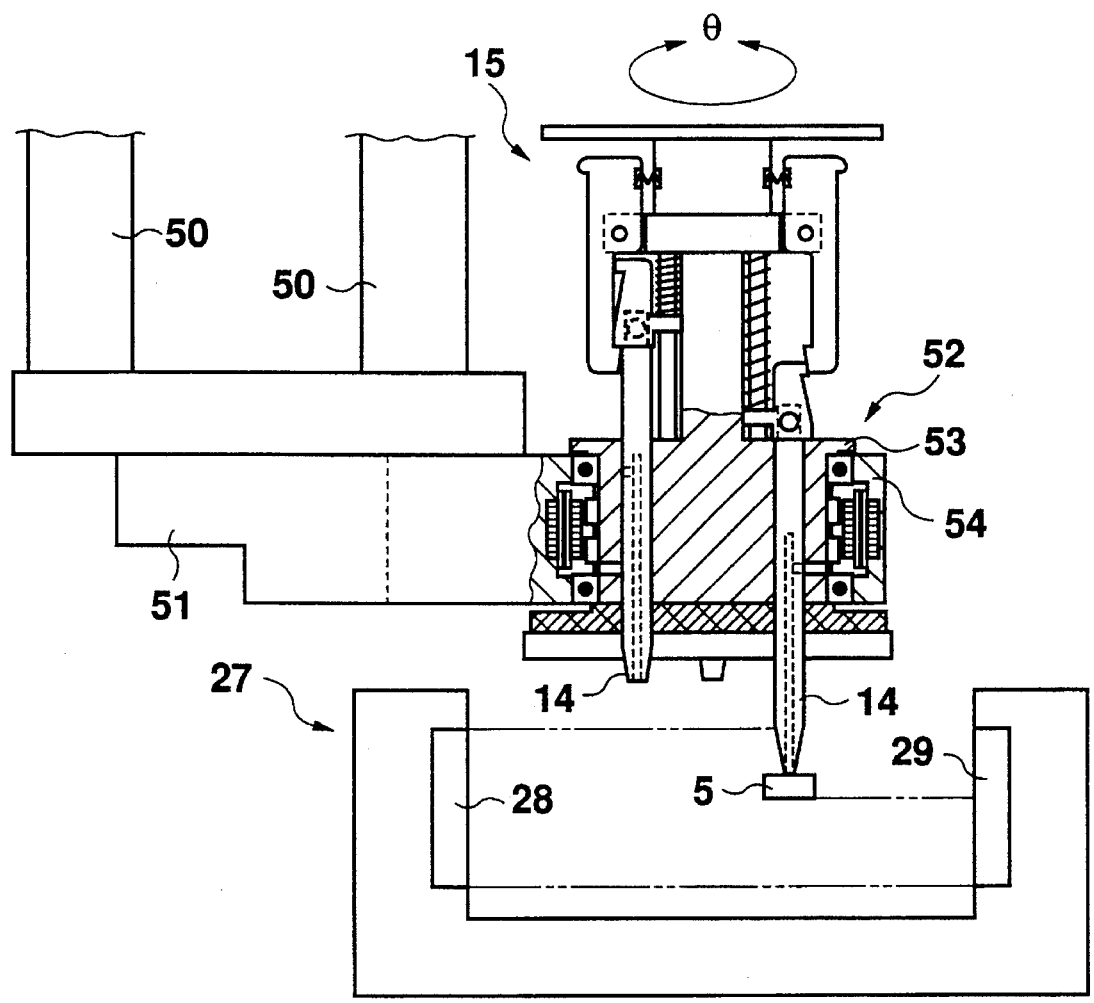
FIG. 9 is a partial cross-sectional view for explanation of the lower end position detecting section and the position adjusting mechanism of the apparatus for automatically mounting electronic parts according to a second embodiment of this invention.

The mounting head 15 will now be described in detail with reference to FIG. 9

A mounting plate 51 made of aluminum is provided at the lower end of the shaft 50, and has a pulse motor 52 mounted.

The rotor 53 of the pulse motor 52 is rotatable in the θ direction within the stator 54 integrally formed with the mounting plate 51.

The holding nozzles 14 (six, for example) are provided, each of which is movable and passes vertically through the rotor 53.

As a result, the holding nozzle 14 for picking up the part 5 by the rotation of the rotor 53 can be positioned regardless of the movement or stopping of the rotary table 13 at a desired angular position. The driving of the pulse motor 52 is carried out under the control of the driving circuit, described hereinafter mentioned, and the driving power source is connected via a cord 19 (see FIG. 3).

The controlling block of an automatic electronic parts mounting apparatus according to a second embodiment will now be described with reference to FIG. 10.

Figure 10:
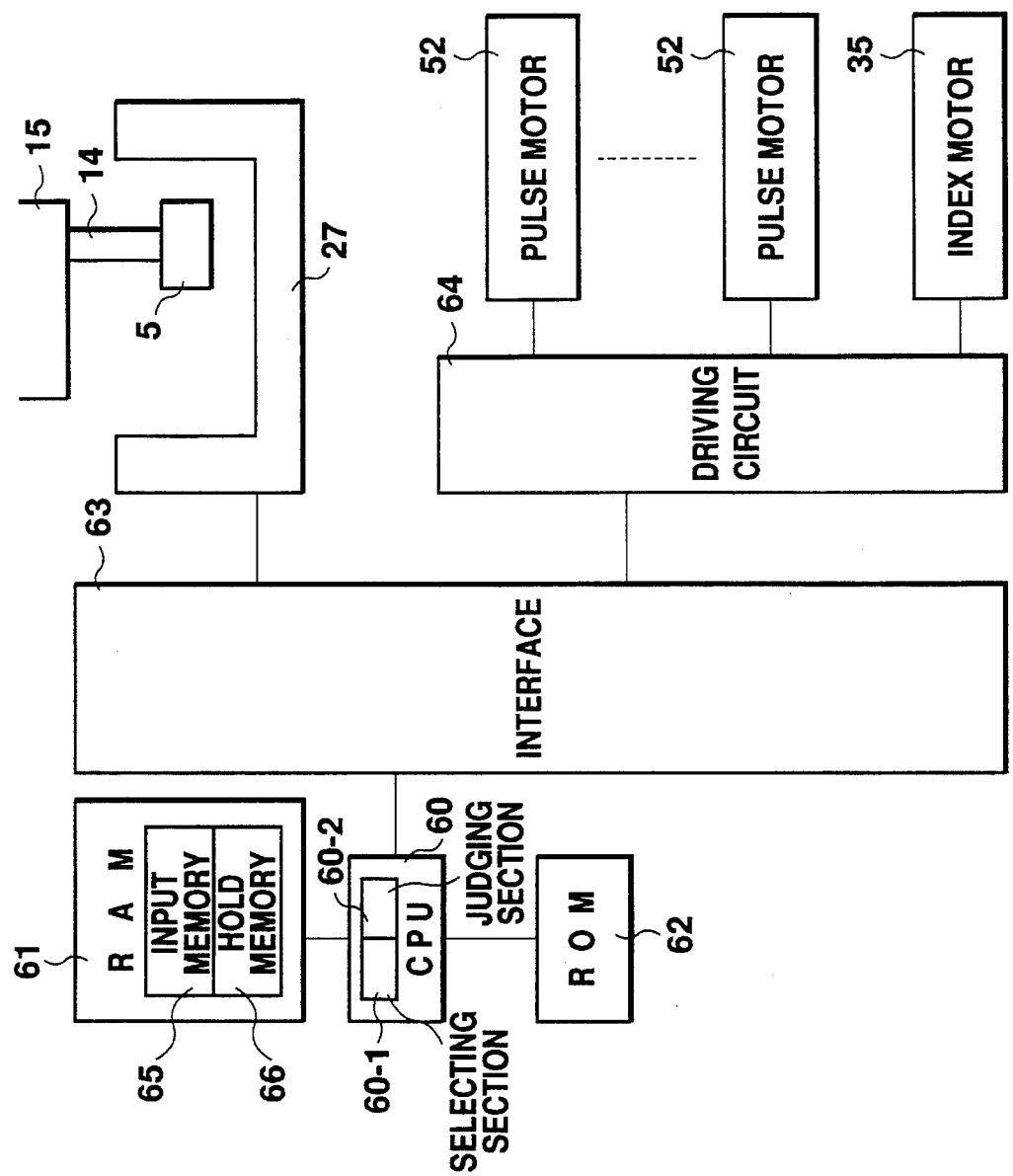
FIG. 10 is a block diagram of an apparatus for automatically mounting electronic parts according to a second embodiment of this invention.

In FIG. 10, a CPU 60 controls a variety of operations related to the mounting of the chip parts 5 in accordance with the program stored in the ROM 62 on the basis of a variety of data stored in the RAM 61 and information received from the sensors and the like, such as the line sensor 27. The line sensor 27 is connected to the CPU 60 via the interface 63. The index motor 39 and the pulse motor 52 of the rotary table 13, being the control target of the CPU 60, are connected to the CPU 60 via the interface 63 and the driving circuit 64.

The output of the line sensor 27 is made from each of the CCDs likewise in the first embodiment, but the height position at the border between the element being light-interrupted at the lowest position and the element receiving light next thereto is calculated as the lower peak value being the lower end position, by the CPU 60.

The operations of the input memory 65, and the hold memory 66 included in the RAM 61, are the same as in the first embodiment, in which the data at the lowest end position of the part 5 is stored in the hold memory 66.

The RAM 61, in the same manner as in the first embodiment, contains data for each part as shown in FIG. 6 to be used for the comparison with the lowest end position.

In operation, a manipulating section not shown is operated to start the automatic driving of the automatic electronic parts mounting apparatus.

Likewise the first embodiment, the part 5 is picked up.

The rotary table 13 is then intermittently rotated via an index mechanism not shown by the rotation of the index motor 35. The nozzle head 15 moves to and stops at the next station, and further moves to the parts orientation detecting station IV provided with the line sensor 27 by the next rotation.

Figure 11:
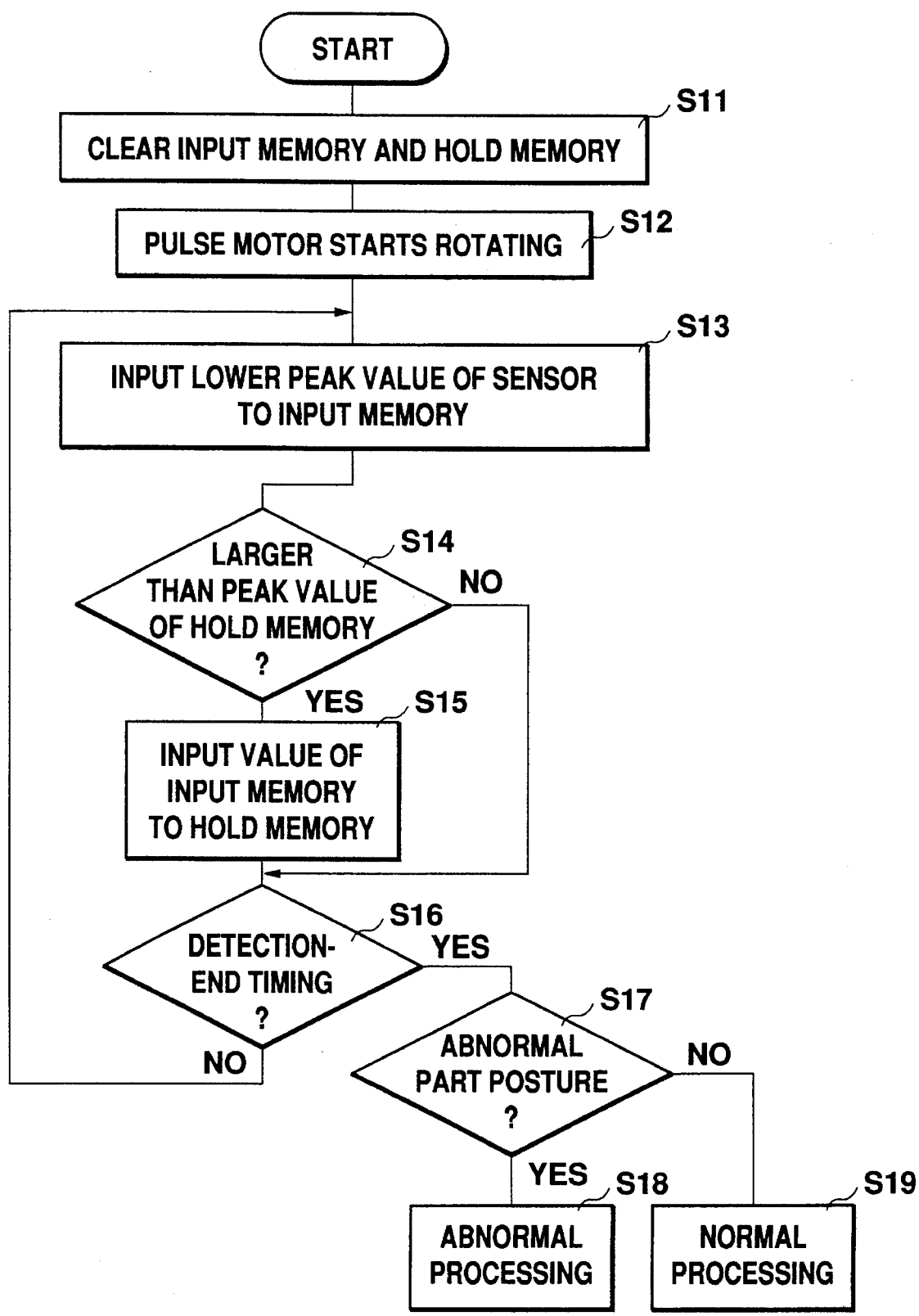
FIG. 11 is a flow diagram for explanation of operation of the apparatus for automatically mounting electronic parts according to the second embodiment of this invention.

When the rotary table 13 stops, the CPU 60 detects the parts orientation as described in the flow diagram of FIG. 11.

Namely, the input memory 65 and the hold memory 66 are cleared (S11), and the pulse motor 52 starts rotating in response to the command from the CPU 60 (S12). The light emitter 28 of the line sensor 27 continuously emits a light beam, which is continuously received by the light receiver 29 which continuously generates an output. It is also possible to construct the detection part so that the light emitter 28 emits lights and the output of the line sensor 27 starts when the motor 52 starts rotating or the rotary table 13 stops rotating.

The CPU 60 then calculates the lowest position of border from light-interrupted to light-received state as the lower end peak value, which is then stored in the input memory 65 (S13). This value is set such that the origin becomes higher than the height position of the lower end surface of the holding nozzle 14 with the lower side positive.

The selecting section 60-1 of the CPU 60 compares the lower end peak value to the value of the hold memory 66 as in the first embodiment (S14), the stores the larger one in the hold memory 66 (S15). While the CPU 60 performs this process, the nozzle 14 continues rotating. The CPU 60 repeats the same process until the detection end timing (S16). The position where the lower end peak value of the chip part 5 is firstly detected is the position of the two-dot chain line connecting between the light emitter 28 and the light receiver 29 in FIG. 12. If the rotating direction of the holding nozzle 14 is in the clockwise direction in FIG. 12, the next detecting position will become the next two-dot chain line in the counterclockwise direction in FIG. 12. The peak value of the input memory 65 secondly detected and the value in the hold memory 66 are mutually compared, and if the value of the input memory 65 is larger, the value of the hold memory 66 is renewed to the value of the input memory.

Figure 12:
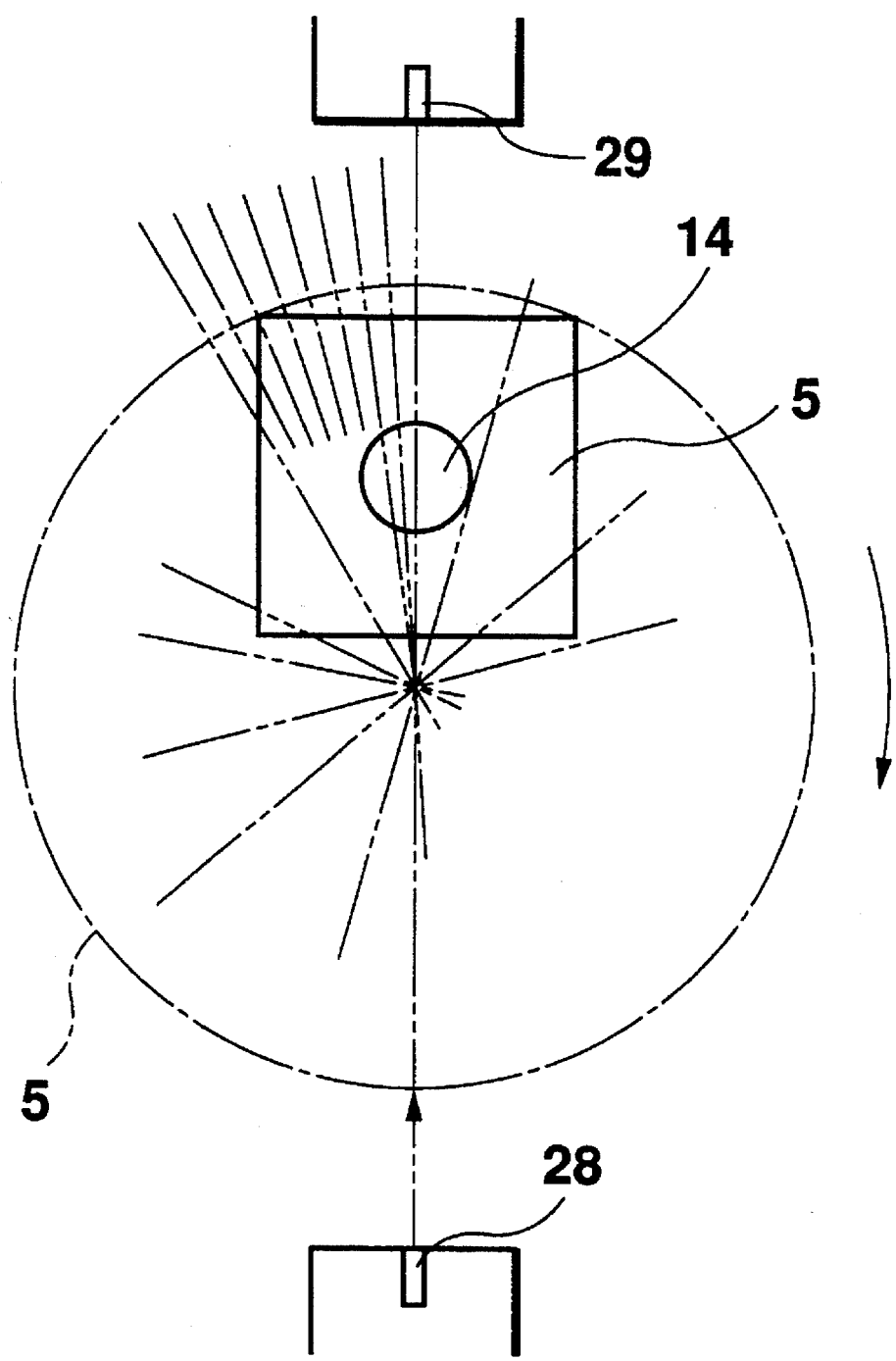
FIG. 12 is an explanatory plan view of the lower end position detecting state of the lower end position detecting section of the apparatus for automatically mounting electronic parts according to the second embodiment of this invention.

In this manner, by the driving of the pulse motor 52, the lower end peak values of the chip part 5 will be detected with a predetermined interval as shown by way of a two-chain dot line in FIG. 12 as the nozzle 14 rotates by the driving of the pulse motor 52. The higher the speed of the aforementioned process of the CPU 60 or the lower the rotating speed of the pulse motor 52, the narrower the interval that can be detected.

Figure 13:
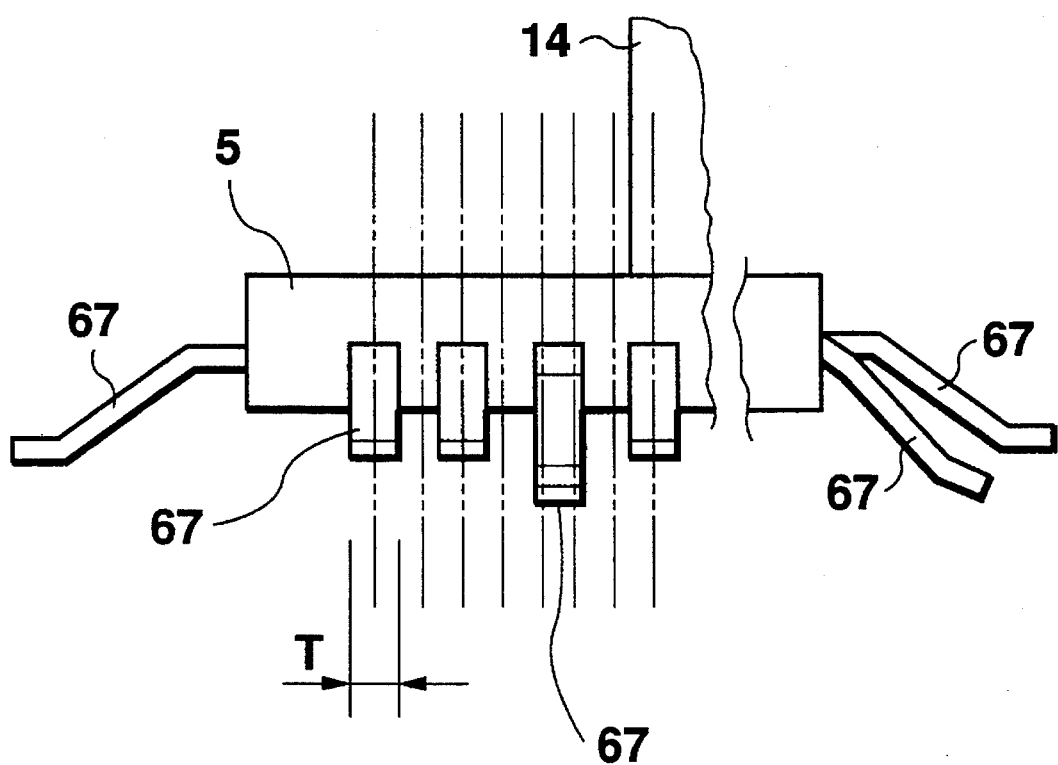
FIG. 13 is an explanatory side view of the lower end position detecting state of the lower end position detecting section of an apparatus for automatically mounting electronic parts according to the second embodiment of this invention.

Therefore, in the case of detecting a chip part 5 having projected leads 67 called a QFP (Quad Flat Package) or SOP (Small Outline Package), as shown in FIG. 13, the lower end position can be stored in the hold memory 66 by setting the rotating speed of the motor 52 such that the detecting interval becomes smaller than the lateral thickness T of the lead 67.

In this manner, when the motor 52 rotates 180 degrees, the CPU 60 judges that it is the detection end timing. The judging section 60-2 of the CPU 60 compares the value in the hold memory 66 to the part data to be compared and stored in the RAM 61. The data to be compared are, in the case a part having the lead 67, the value yielded by adding the thickness value including the lead 67, to the nozzle level data, being the lower end position of the holding nozzle.

This detection end timing is used because the lower end peak value can be detected for all the parts regardless of their size, just by rotating the pulse motor 52 by 180 degrees. Alternatively, however, it is also possible to set it as the end timing when the motor 52 is rotated by 360 degrees. Further, as shown in FIG. 12, if the size of the part 5 is small, there will be no rotary center of the holding nozzle in the part 5, so that the lower end peak value for all the part 5 can be detected without the need to rotate 180 degrees. In this case, the rotating angle as the detection end timing can be previously set in accordance with the size of the part 5, but alternatively it is also possible to set the holding nozzle 14 at a position where the light from the line sensor 28 is not interrupted by the part 5, by rotating it counter-clockwise in FIG. 12 by the motor 52 before the mounting head 15 stops at the part orientation detecting station IV, so as to detect the lower end peak value by rotating it in accordance with the size of the part 5.

If the difference between the value obtained by adding the calculated parts thickness data to the nozzle level data and the value in the hold memory 66 is out of the parts thickness tolerance, and the value in the hold memory 66 is larger, it is judged that there is a holding abnormality (orientation defect or bent lead) so as to perform the following operations to correct the abnormality (S17~S18).

Namely, as processes to correct an abnormality, even if the holding nozzle 14 stops at the following stations, no parts mounting operations are executed, but the chip part 5 is evacuated at the predetermined evacuating station.

Meanwhile, when the chip part 5 is correctly made and this part 5 arrives at the part posture detecting station by the movement of the nozzle head 15, the pulse motor 52 rotates and the height level of the lower end surface of the part 5 is calculated and supplied to the input memory 65 each time the CPU 60 reads the output of the line sensor 27, and the lowest end position data are stored in the hold memory 66.

When the holding is carried out correctly, the value in the input memory 65 does not exceed a predetermined value, so that the CPU 60 judges that there is no part orientation abnormality after the detection end timing. In the same manner as aforementioned, the CPU 60 compares the lowest end position to the lower end position from the nozzle data of the parts data and the part thickness data, and judges as correct when it is within the tolerance, and controls the following normal processing operations (S19).

Namely, the identifying device 16 executes identifying process at the identifying station 120. In the first embodiment, the head rotating device 17 adjusted the angle of the part 5 on the basis of the identified result in the identifying device 16, but in this second embodiment, instead of using the head rotating device 17, the pulse motor 52 rotates to control the angle of the part 5 on the basis of the identified result. At the mounting station 100 the chip part 5 is mounted on the printed substrate 6 positioned by the movement of the XY table 3, 1. At this time since the lower end position, being the height position of the lower end of the part 5, is already detected, the descending distance of the holding nozzle 14 is adjusted to accord to the lower end position, and the part 5 is then mounted on the printed substrate 6 by a proper pressure.

The processing to correct the abnormality such as non-collection of the part 5, entoneous picking up of a different part etc. will be executed in the same manner as in the first embodiment.

In this manner, the orientation abnormality of the part 5 is judged each time when the part 5 moves to the part orientation detecting station 140 of the line sensor 27, for suitable treatment.

In the first and the second embodiments, the reading of the output from the next line sensor 27, by the CPU, has been made immediately after the processing of calculation of the lower end position and the comparison of the data in the input memory to that of the hold memory etc., but it is alternatively possible to set the reading interval to be longer and to perform other processes during this interval, or to provide the functions shown in FIGS. 7 and 11 as a processing unit composed of an input memory and a hold memory which is connected to the CPU of the automatic electronic parts mounting apparatus via an interface, while the other side is coupled to the line sensor. In this case, it is also possible for the CPU of the mounting apparatus to supply the detection starting timing and the detection end timing synchronously with the rotation of the adsorptive nozzle 14, and for the contents of the hold memory, after the detection end, to be read by the CPU of the mounting apparatus to judge the abnormality.

Figure 14:
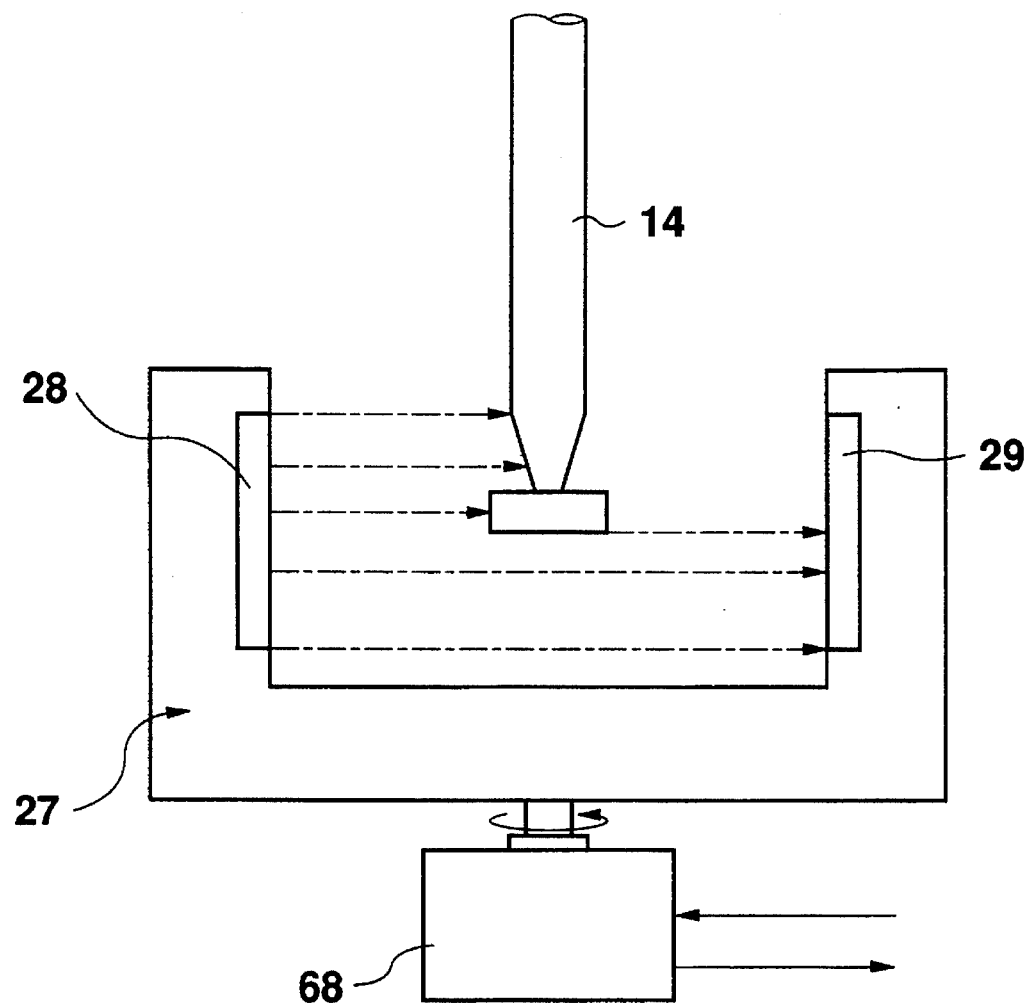
FIG. 14 is an explanatory view of another example of a position adjusting mechanism of the apparatus for automatically mounting electronic parts according to the second embodiment of this invention.

In this embodiment, the lower end peak value for the entire surface of the part 5 is detected by rotating the pulse motor 52 at the parts detecting station, but it is also possible to carry out the similar detection by rotating the line sensor 27 by the pulse motor 68 as shown in FIG. 14, such that the light axis passes across the entire surface of the part.

Furthermore, if the rotation of the nozzle 14 is not completed within the time during which the mounting head 15 stops by the intermittent rotation of the rotary table 13, the stopping time of the rotary table 13 may be extended.

In the first and the second embodiments, there has been described the rotary table-type automatic electronic parts mounting apparatus, but alternatively it is also possible to provide a line sensor in the way of the head moving path by using a mounting apparatus in which the mounting head is provided on the XY table and moves to pick up the part supplied from the parts supplying section in order to mount it at a predetermined position on the printed substrate.

Further, while the lower end position has been calculated by adding the part thickness data and the nozzle level data stored in the RAM 36 in the aforementioned embodiments, it is also possible to directly store the lower end position data therein. In addition, the lowest end position has been decided by comparing the actually input lower end position to the previously input lower end position, but it is also possible to select the lowest end position after a plurality of such positions are input.

Furthermore, in the second embodiment, the rotor 53 having a plurality of nozzle heads 15 has been rotated by the holding nozzle 14, but it is also possible for the adsorptive nozzle itself provided in the mounting head to be able to rotate to be capable of being detected by the line sensor.

What is claimed is:

1. An apparatus for automatically mounting chip-like electronic parts fed from a parts feeding device at predetermined positions on a printed substrate, said apparatus comprising:

a holding nozzle for picking up the electronic parts one by one;

a nozzle head having at least one holding nozzle;

a movable base for intermittently moving said nozzle head between a plurality of work stations;

a lower end position detecting section for identifying lower ends of the electronic parts picked up by said holding nozzle at a plurality of points during the moving or stopping time of said nozzle head so as to detect a plurality of lower end positions;

a lower end position memory section for storing the lower ends detected by said lower end detecting section;

a selecting section for selecting the lowest end among the lower end positions detected by said lower end detecting section;

a data memory section for storing shape information including a reference lower end position for each sort of electronic part; and a judging section for judging if the picked up state of the electronic parts is correct or not from an error of the lower end positions obtained by comparison of the lowest end position selected by said selecting section to the reference lower end position stored in said data memory section.

2. An apparatus according to claim 1, wherein said lower end position detecting section is a line sensor having a plurality of vertically arranged light-emitting elements and a plurality of vertically arranged light-receiving elements, each being positioned opposite to each of said light emitting element.

3. An apparatus according to claim 1, wherein said lower end position memory section includes a tentative holding part for tentatively holding the lower end position detected by said lower end position detecting section, and a renewable lowest end position memory part for storing the lowest end position among the lower end positions being held in the tentative holding part; and said selecting section compares the lowest end position being stored in the lowest end position memory part to a lower position being held in the tentative holding part, each time a lower position is input to said tentative holding section, and stores the lower one in said lowest position memory section as a renewed lowest end position.

4. An apparatus according to claim 1, wherein:

said apparatus further comprising a position adjusting mechanism for adjusting a position of said holding nozzle relative to said lower end position detecting section.

5. An apparatus according to claim 4, wherein:

said position adjusting mechanism acts to rotate said holding nozzle relative to said lower end position detecting section.

6. An apparatus according to claim 4, wherein said position adjusting mechanism acts to rotate said lower end position detecting section around said holding nozzle.

7. An apparatus according to claim 1, wherein said movable base is a rotary table.

8. An apparatus according to claim 2, wherein:

said lower end position memory section has a tentative holding part for tentatively holding a lower end position detected by said lower end position detecting section, and a renewable lowest end position memory part for storing the lowest end position among the lower end positions held in said tentative holding part; and said selecting section compares the lowest end position stored in said lowest end position memory part to the lower end position being held in said tentative holding part, each time a lower position is input to said tentative holding part, and stores the lower one in said lowest end position memory part as a renewed lowest end position.

9. An apparatus according to claim 8, wherein:

said movable base is a rotary table.

10. An automatic electronic parts mounting apparatus according to claim 9, wherein:

said apparatus further comprises a position adjusting mechanism for adjusting a position of said holding nozzle relative to said lower end position detecting section.

11. An apparatus according to claim 10, wherein:

said position adjusting mechanism acts to rotate said holding nozzle relative to said lower end position detecting section.

12. An apparatus according to claim 10, wherein:

said position adjusting mechanism acts to rotate said lower end position detecting section around said holding nozzle.

13. A method for mounting electronic parts on a printed substrate by taking out the parts from a parts feeding section using an holding nozzle provided on a movable base, said method comprising steps of:

picking up electronic parts by the holding nozzle;

detecting a lower end position at a plurality of positions at lower ends of electronic parts during the moving or stopping time of the movable base;

judging abnormality of orientation or shape of the electronic parts by comparison to reference data on the basis of a plurality of lower end positions detected in said lower end position detecting step; and mounting only electronic parts, having been judged as normal in said judging step, on the printed substrate.

14. A method for mounting electronic parts on a printed substrate by taking out the parts from a parts feeding section using an holding nozzle provided on a movable base, said method comprising steps of:

picking up electronic parts by the holding nozzle;

detecting lower end positions at a plurality of positions at lower end portions of the electronic parts by adjusting the relative position of the holding nozzle to the lower end position detecting section for detecting the lower end positions of the electronic parts being held by the holding nozzle during the moving or stopping time of the movable base;

judging abnormality of orientation or shape of the electronic parts by comparison to reference data on the basis of a plurality of lower end positions detected in said lower end position detecting step; and mounting only electronic parts, having been judged as normal in said judging step, on the printed substrate.

* * * * *